United States Patent [19]

Kee et al.

[11] Patent Number: 5,583,780
[45] Date of Patent: Dec. 10, 1996

[54] METHOD AND DEVICE FOR PREDICTING WAVELENGTH DEPENDENT RADIATION INFLUENCES IN THERMAL SYSTEMS

[76] Inventors: Robert J. Kee, 864 Lucille St., Livermore, Calif. 94550; Aili Ting, 7329 Stonedale Dr., Pleasanton, Calif. 94558

[21] Appl. No.: 366,579

[22] Filed: Dec. 30, 1994

[51] Int. Cl.$^6$ ............................................. G06F 19/00
[52] U.S. Cl. ........................................ 364/468.24; 364/149
[58] Field of Search .................................. 364/149, 468

[56] References Cited

U.S. PATENT DOCUMENTS

| | | | |
|---|---|---|---|
| 4,796,194 | 1/1989 | Atherton | 364/468 |
| 5,105,362 | 4/1992 | Kotani | 364/468 |
| 5,111,404 | 5/1992 | Kotani | 364/468 |
| 5,305,221 | 4/1994 | Atherton | 364/468 |
| 5,347,460 | 9/1994 | Gifford et al. | 364/468 |
| 5,408,405 | 4/1995 | Mozumder et al. | 364/151 |

OTHER PUBLICATIONS

Peter Singer, Rapid Thermal Processing: A Progress Report, Semiconductor International, May 1993, pp. 64–69.

Laura Peters, The Hottest Topic in RTP, Semiconductor International, Aug. 1991, pp. 56–62.

Lie, H., et al., "Simulation of Thermal Thermal Processing Equipment and Processes", Rapid Thermal Integrated Processing II, Materials Research Society Proceedings; 303, 197–209 (1993).

Ting, A, "The Influence of Wavelength–Dependent Radiation in Simulation of Lamp–Heated Rapid Thermal Processing Systems," 2nd International Rapid Thermal processing Conference, RTP '94, Round Rock, TX, 102–109 (1994).

Kee, et al., "A Differential/Algebraic Equation Formulation of the Method–of–Lines Solution to System of Partial Differential Equation", Sandia National Laboratories, SAND 86–8893 (1986).

Petzold, "A Description of a DASSL: A Differential/Algebraic System Solves", Sandia National Laboratories, SAND 82–8639 (1982).

*Primary Examiner*—Roy N. Envall, Jr.
*Assistant Examiner*—Y. Kundupoglu
*Attorney, Agent, or Firm*—Donald A. Nissen; Timothy D. Stanley; Gregory A. Cone

[57] ABSTRACT

A method and apparatus for predicting the spectral (wavelength-dependent) radiation transport in thermal systems including interaction by the radiation with partially transmitting medium. The predicted model of the thermal system is used to design and control the thermal system. The predictions are well suited to be implemented in design and control of rapid thermal processing (RTP) reactors. The method involves generating a spectral thermal radiation transport model of an RTP reactor. The method also involves specifying a desired wafer time dependent temperature profile. The method further involves calculating an inverse of the generated model using the desired wafer time dependent temperature to determine heating element parameters required to produce the desired profile. The method also involves controlling the heating elements of the RTP reactor in accordance with the heating element parameters to heat the wafer in accordance with the desired profile.

13 Claims, 7 Drawing Sheets

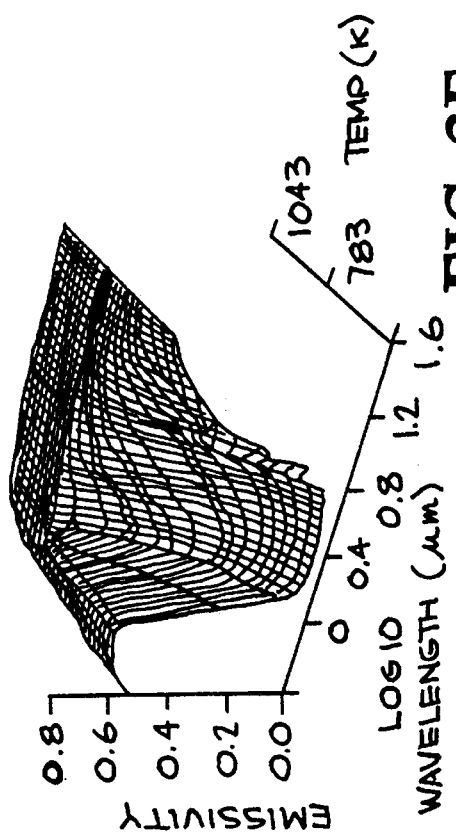
FIG. 3F
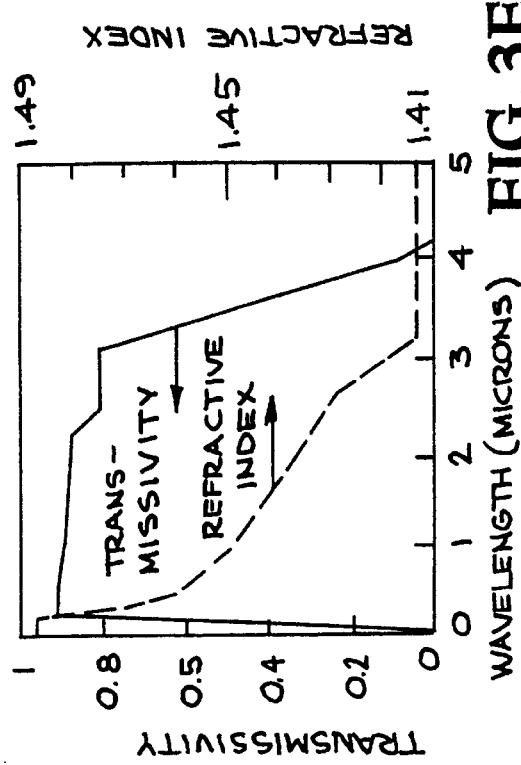
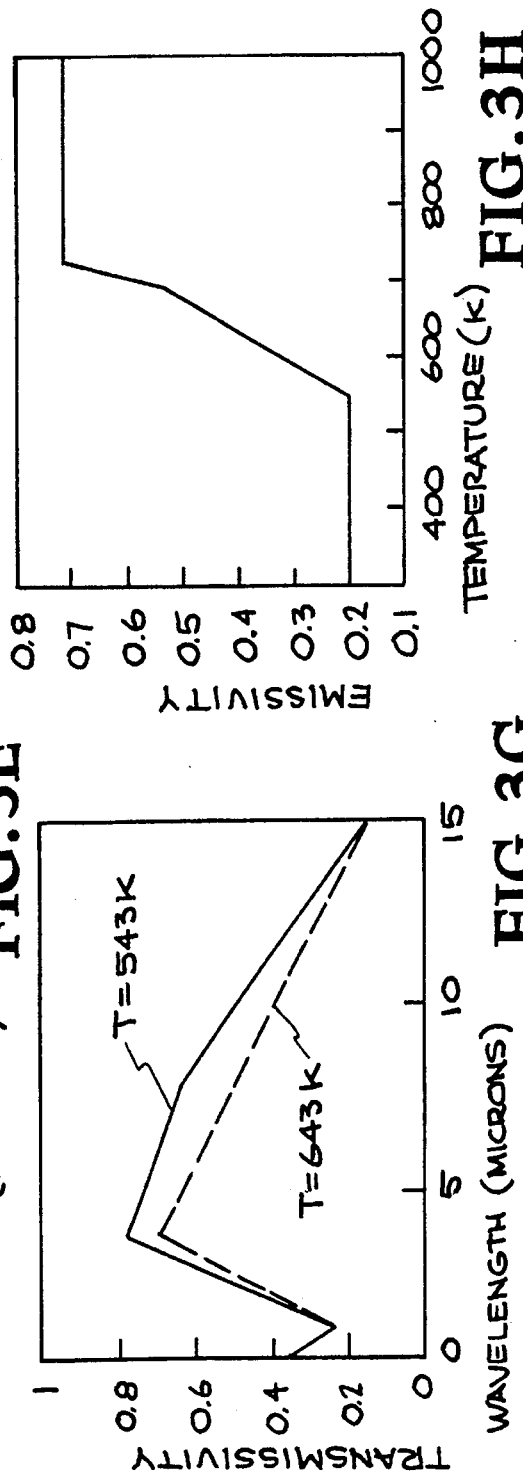
FIG. 3E
FIG. 3G
FIG. 3H

METHOD AND DEVICE FOR PREDICTING WAVELENGTH DEPENDENT RADIATION INFLUENCES IN THERMAL SYSTEMS

BACKGROUND OF THE INVENTION

The instant invention is directed to a method and apparatus for predicting wavelength dependent radiation influences in thermal systems, and more particularly for predicting such influences in systems including semitransparent mediums in a relatively simply manner such that the predictions can be rapidly carried out. The predictive system includes a model which may be executed quickly on workstation class computing platforms and may be used, for example, in the design and control of rapid thermal processing (RTP) systems by permitting rapid comparison of alternative reactor designs and physical models as well as real-time model-based control procedures.

Prior attempts to simulate complex thermal systems such as RTP reactors have generally followed two approaches. In a first approach two-dimensional and three-dimensional finite-element or finite-volume approaches have been used to model the heat transport and coupled fluid flow in the reaction chamber. In such systems, the radiation exchange is handled through radiation view or exchange factors. Such approaches generally consider only gray-diffuse view factors. One approach, described in Lie et al., "Simulation of Thermal Processing Equipment and Processes," *Rapid Thermal and Integrated Processing II, Material Research Society Symposium Proceeding*, 303 (1993), also considers specular reflection in their exchange factors. Gray-diffuse view factors are calculated by geometry. Typically, the specular exchange factors are calculated using Monte-Carlo, ray-tracing software. Such a modeling technique is disadvantageous in that it is complex and requires a relatively long time to run.

The second approach to RTP modeling is based on process control. In these efforts, the models consider only one-dimensional conduction in the wafer, with convective and radiative heat fluxes considered at the wafer surfaces. The radiation is computed in terms of geometric gray-diffuse view factors that couple the lamp system to the wafer. While such models may be run relatively quick on a computer, and are therefore suitable for use in designing the real-time control algorithms, these approaches do not take into account non-gray wavelength-dependent radiation.

Because radiation is an electromagnetic wave, an accurate model of radiative energy transport must include the influences of spectral (wavelength-dependent) and directional factors. The conventional technique treats radiative heat transfer between surfaces as diffuse reflectors and diffuse emitters-absorbers. In this way, the problem of diffuse surface interchange is reduced to a geometric problem of determining the view factors between all interacting surfaces, and the directional effects are eliminated.

The values of surface radiation properties (emissivity, transmissivity, and reflectivity) depend on the wavelength, thermodynamic state (e.g., temperature and composition or mole numbers) and the morphology of the surface (e.g., surface roughness). In other words, the radiation emitted, reflected, transmitted and absorbed by a solid body depends on the radiative properties of the material, temperature of the body, viewing direction and the surface conditions.

Typically, conventional attempts to solve the complexity of the radiative transport consider only wavelength-independent radiation (gray-diffuse). Alternatively, some kind of indirect way to estimate roughly the wavelength-dependent effects is employed. These approaches are not satisfactory, since spectral emissivity plays an important role in the behavior of radiative heat exchange between materials.

SUMMARY OF THE INVENTION

It is therefore an object of the instant invention to provide a method and apparatus for determining, that is, accurately modeling or predicting, wavelength dependent radiation influences in thermal systems in a manner which can be implemented sufficiently rapidly to overcome the above mentioned drawbacks.

Still another object of the instant invention is to use the method and apparatus of the instant invention to more accurately and rapidly design and control rapid thermal processing (RTP) systems by permitting fast comparison of alternative reactor designs and physical models as well as real-time model-based control procedures.

To accomplish these and other objects of the invention, there is provided a system which includes a modeling apparatus for accurately characterizing time dependent spectral thermal radiation transport of a thermal system. The thermal system has a first portion having one or more heating elements, and a second portion separated from the first portion by a partially transmitting medium. The modeling apparatus includes: an input device for inputting characteristics of the thermal system; a memory connected to the input device for storing the thermal system characteristics, the thermal system characteristics including at least geometric parameters of the thermal system, a time dependent intensity profile of the heating elements and wavelength-dependent properties of the partially transmitting medium; a processing unit connected to the memory, the processing unit predicting a time dependant spectral thermal radiation transport characteristic of the thermal system based on the thermal system characteristics; and means for producing a characteristic model of the thermal system using the time dependant spectral thermal radiation transport characteristic.

In accordance with another embodiment of the invention, there is provided a method of controlling a rapid thermal processing (RTP) reactor for processing a silicon wafer under a desired wafer time dependent temperature profile. The RTP reactor includes a heating element and a partially transmitting component separating the heating element from the wafer. The controlling method includes the steps of: generating in a computer a spectral thermal radiation transport model of the RTP reactor for given heating element parameters; inputting into the computer data specifying the desired wafer time dependent temperature profile; calculating an inverse of the generated model using the data specifying the desired wafer time dependent temperature profile to determine heating element parameters required to produce the desired wafer time dependent temperature profile; and controlling the heating elements of the RTP reactor in accordance with the heating element parameters to heat the wafer in accordance with the desired wafer time dependent temperature profile.

In accordance with still another embodiment of the invention there is provided a method of designing a rapid thermal processing (RTP) reactor for processing a silicon wafer which will include at least one lamp heating element and a partially transmitting component separating the lamp heating element and the wafer. The designing method includes the steps of inputting data into a computer corresponding to a general design of the RTP reactor including at least the thermal transport characteristic of the partially transmitting component and the wafer and the general design of the thermal radiation characteristic of the lamp heating element; generating in the computer a model of spectral thermal radiation transport of the RTP reactor based on the input data; and selecting components for the RTP reactor based on the model.

BRIEF DESCRIPTION OF THE DRAWINGS

The instant invention will be better understood from the following detailed description of embodiments of the invention in connection with the accompanying drawings, in which:

FIGS. 3A-3H illustrate effects of assumptions made in input parameters used by the apparatus of FIG. 1;

DETAILED DESCRIPTION OF THE PREFERRED EMBODIMENTS

Figure 1:
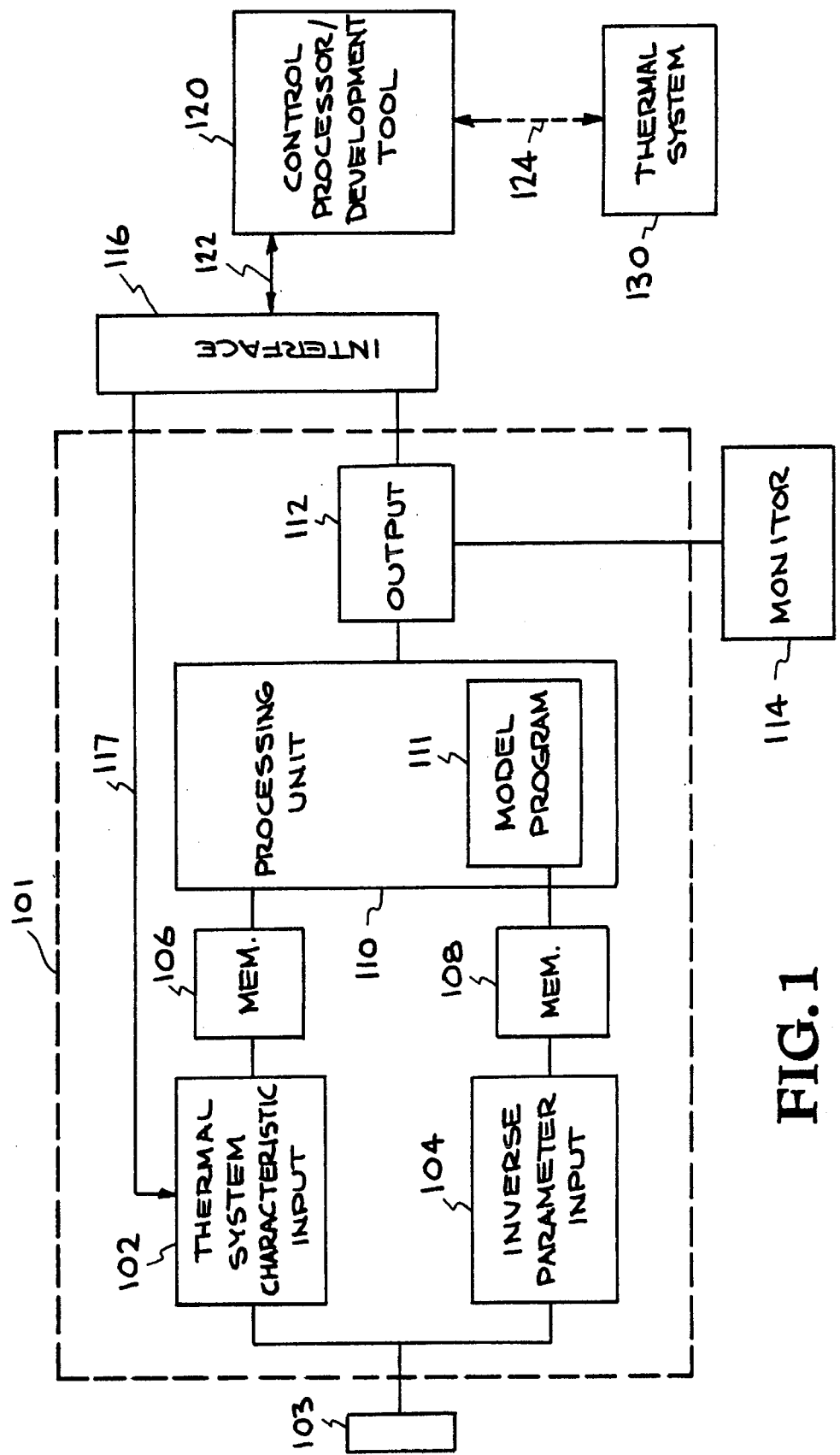
FIG. 1 illustrates an apparatus in accordance with an embodiment of the instant invention.

In accordance with the instant invention, a physical model of wavelength dependent radiation transport in a thermal system having particular characteristics is generated in a modeling apparatus, e.g., in a workstation or other computing platform. An apparatus according to an embodiment of the instant invention is depicted in FIG. 1. In FIG. 1, a modeling apparatus 101 is generally shown. As more fully described below, the modeling apparatus 101 generates a model of a thermal system sufficiently rapidly to permit the model to be used in design of the thermal system as well as in the development of control software for the thermal system using real-time feed back from the modeling apparatus 101. In other words, the modeling apparatus 101 may be used to develop a model of the thermal system 130 prior to construction, and the design may be tested using the modeling apparatus 101 for desired performance characteristics. Since the results of the modeling apparatus 101 can be generated very fast, many alternative design parameters may be considered in designing the system in a relatively short period of time. Because the modeling apparatus 101 considers the wavelength dependence of the radiation transport of the thermal system, the modeling apparatus 101 can be used to accurately construct systems requiring stringent temperature control. This is particularly useful in systems where the thermal system includes opaque and partially opaque elements interacting with the thermal radiation.

The modeling apparatus 101 has a thermal system characteristic input section 102 for receiving input characteristics of a thermal system to be modeled from an input device 103 which may include, for example, a keyboard, a mouse, an interface to another computer platform, etc. The thermal system characteristics are stored in a memory 106 under control of the thermal system characteristic input section 102. A processing unit 110 (e.g. a CPU) connected to the memory 106, uses the characteristics about the thermal system stored in memory 106 to predict the operation of the thermal system including the wave-length dependent thermal radiation transport in accordance with a modeling program 111. The operation of this system and the manner in which it develops a wavelength dependent thermal transport model will be further explained in connection with a more specific example of an RTP system provided below.

The predictive model generated by the modeling apparatus 101 is provided to an output section 112. The output section 112 may be connected to a monitor 114, for example, to display the results. Alternatively, the output could be provided to any number of output devices, such as a printer, plotter, etc. These results may be used in the design of a thermal system directly by comparing the model generated by the modeling apparatus 101 with a desired function or characteristic of the thermal system to be built.

The modeling apparatus 101 of the instant invention may also be used to perform an inverse analysis to establish the boundary conditions or parameter values required to achieve a certain function of the thermal system. This allows the apparatus to be used to establish the appropriate process parameters and boundary conditions for the thermal system modeled. In accordance with the instant invention, the inverse analysis can be directly carried out by the modeling apparatus rather than using the conventional approach, which merely solves the direct problem repeatedly, in a lengthy and costly iterative process, to determine appropriate input parameters to achieve a desired result. In other words, in accordance with the instant invention, once a particular thermal process is modeled for a particular set of control parameters, the device may then be used to automatically obtain the necessary control parameters to achieve a desired result by providing the modeling apparatus with parameters corresponding to the desired result.

To carry out the inverse analysis, the modeling apparatus 101 includes an inverse parameter input section 104 also connected to input device 103. A user inputs into the modeling apparatus 101 parameters corresponding to desired results, e.g., desired temperature characteristics of the system, which are stored in memory 108. The processing unit 110, under control of modeling program 111, uses the previously generated model of the thermal system and the parameters held in memory 108 and derives or predicts particular control parameters to meet the constraints entered through the inverse parameter input section 104. This process is more fully described below in connection with the examples provided.

In the above description, a general inverse analysis is carried out by providing specific parameters of a desired end result. Alternatively, dynamic optimization may be used rather than specifying the desired trajectories as specific constraints. In this manner, the desired results are specified as least-squares inequality constraints. For example, if the system were used in an RTP reactor to control the temperature of a silicon wafer during a reaction process, as more fully described below, instead of requiring exact temperature-time histories at certain points on the wafer (the general inverse analysis problem), the wafer would simply be required to follow a specified temperature trajectory within plus or minus 10 degrees and with no more than 5 degrees temperature variation within the wafer.

Using the inverse analysis and/or the dynamic optimization of the instant invention allows the system to be used as a powerful design tool. For example, the apparatus may be used to evaluate and understand trajectory feasibility and control authority. For example, if the system were used to design a nominal chemical vapor deposition (CVD) reactor which is to include a maximum heater power of 50 kW and is to be used to carry out a process that calls for a particular temperature ramp to the required process temperature, the inverse model produced by the instant invention can be used to provide power-time histories for the heaters (more fully described below). If the required power exceeds the maximum available for the given design, then the desired trajectory is not feasible with that design. The constraints would either have to be relaxed or an alternate design developed that provided sufficient "control authority."

In accordance with another embodiment of the invention, as further illustrated in FIG. 1, the modeling apparatus 101 can be used to develop real-time control systems for a particular thermal system. Conventional modeling schemes run "open loop," that is, without feed back. Conversely, nearly all processing equipment is run under "closed loop" process control. Thus, such conventional modeling schemes are not adaptable to use in real-time base development of control routines. In accordance with the instant invention, the modeling apparatus 101 operates sufficiently quick enough to be connected in a closed loop fashion to a control system development tool 120. In most instances, the control system will be implemented on some sort of computing platform and the control program will be implemented in software. However, the instant invention could be used in connection with other types of control systems which are implemented in hardware, for example. The control processor/development tool 120 is comprised of a computer having software development tools loaded thereon. The computer may also be used to control an actual thermal system 130. Of course, separate computers could be used for these two functions. When the modeling apparatus 101 of the instant invention is connected to the control system development tool 120, concurrent engineering of equipment design and control programs can be carried out. In this manner, the thermal system may be modeled in the modeling apparatus 101, and physically based simulations may be run under the control of the very same process-control software that would eventually be loaded into the actual controllers of the thermal system 130 being concurrently designed in real-time (i.e., on the time scale of the actual thermal process).

As illustrated in FIG. 1, the modeling apparatus 101 is connected to the control system development tool 120 via an interface 116. In the control system development tool 120, a control program is loaded and run to control the thermal system generated by the modeling apparatus 101. The modeling apparatus 101 and interface 116 emulate or appear to the control program as an actual thermal system. When the control processor 120 is connected to an actual thermal system 130, the system operates in a closed loop. For example, the control processor 120 controls the thermal radiation source element in the system (i.e., the time/intensity characteristics) by providing control signals along line 124. The thermal system 130 may include temperature sensors (not shown), the output of which is used to return actual measured data to the control processor 120 along line 124. The control processor 120 uses the measured temperatures to adjust the control parameters. In conventional systems, while the control program in the control processor may then be altered on the basis of the actual refined temperatures, since the thermal system is already constructed, the freedom to modify the thermal system design is significant limited.

In contrast, the instant invention can be used to concurrently develop the control program and the actual thermal system 130 design. Via the interface 116, the modeling apparatus provides data to the control development tool 120 which is seen as actual closed loop measured data. In other words, certain dependent variables in the model predicted by the modelling apparatus become the "sensors" (e.g., the temperature measurements returned to the control processor 120) and boundary conditions in the model become the "actuators" (e.g., the power or temperature intensities of heater elements provided as characteristics via line 117), which are controlled by the control software in the control development tool.

Since the two elements are connected by communication interface 116, the controller software and the physical model may be simultaneously executed on different computer platforms. In this manner, both the design of the thermal system (via the input thermal system characteristics provided to the modeling apparatus 101) and the control system (by changing the control program software) may be concurrently designed. Real time control program development can be carried out in the instant invention since the instant invention can rapidly generate an accurate model of the thermal system, including wavelength dependence. In other words, the modeling apparatus of the instant invention generates its model sufficiently quick enough, that it acts as though an actual thermal system.

Below is provided a more specific example of an embodiment of the instant invention used to design and/or control a rapid-thermal-processing (RTP) reactor. RTP reactors are used in silicon-semiconductor fabrication and provide a convenient illustration of the principles of the instant invention and the manner in which the various elements are constructed and used to resolve specific reactor-design and process-optimization problems. Specifically, RTP provides a convenient illustration of the effects of wavelength-dependent (spectral) thermal-radiation transport.

Figure 2:
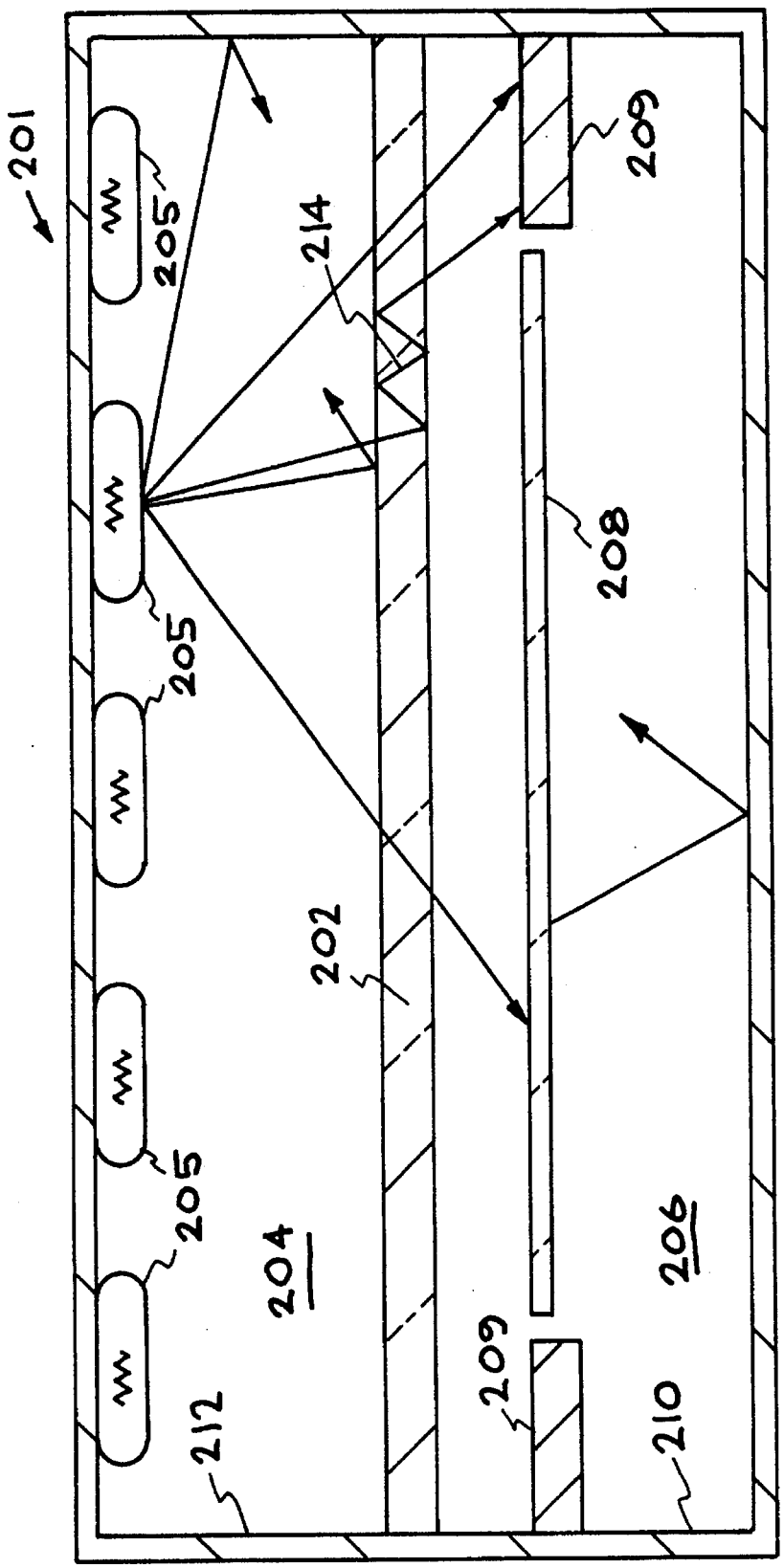
FIG. 2 illustrates a rapid thermal processing (RTP) reactor.

Spectral-radiation behavior is an important consideration in semiconductor processing equipment, especially in lamp-heated systems that have partially transmitting components like quartz windows and the silicon wafer itself. A cross-section of an RTP-reactor 201, is shown in FIG. 2. The window 202, separates the lamp housing 204 from the reaction chamber 206. The lamp housing 204 houses a number of lamp rings 205 which are individually controlled sources of radiant energy. A silicon wafer 208 is provided in the reaction chamber 206 and is supported by the support members 209 which are fixed to the inner walls 210 of the reaction chamber 206. In the modeling apparatus 101 (FIG. 1), the window 202 and the wafer 208 are represented by a radial one-dimensional transient thermal energy equation that describes thermal conduction within the wafer 208 and window 202, convective heat transfer at top and bottom faces thereof, and thermal radiation exchange between the window 202, the wafer 208, and the other features in the system, including the lamp housing and reactor walls 212, 210. The second component of the model is the spectral radiation model. In accordance with the instant invention, the complex radiation exchange between all the surfaces in the reactor, including internal reflections 214 within partially transmitting media (e.g. window 202) are taken into account by the modeling apparatus 101 (FIG. 1). The instant invention considers the radiative energy transport in wavelength bands. The radiation model produced by the modeling apparatus provides net radiative fluxes to the top and bottom surfaces of the wafer 214 and window 202, as well as internal heating due to energy absorption. Coupling between the components is accomplished via the radiative energy fluxes to the window 202 and wafer 208.

In the instant invention, the differential-equation part of the model parameters is essentially one dimensional. The modeling apparatus 101 executes quickly, even when the processing unit 110 is implemented on workstation class computing platforms. Thus, the modeling apparatus 101 quickly accounts for spectral-radiation effects, and, as described above, may be used in design and real-time control systems.

In order to better understand the instant invention, the underlying principles used by the modeling apparatus 101 to produce a model of a thermal system will now be described. For radiation heat flux at each surface in the thermal system, radiative heat exchange in each wavelength band is treated individually. The contribution of all wavelengths are then integrated into a compound radiation energy. The processed spectral radiation model is fully three-dimensional in so far as the geometric view factors consider three-dimensional geometries. While complex geometries for the radiation exchange are considered, the overall processing is simplified by considering only one-dimensional energy transport in the wafer 208 and window 202.

While the processing unit 110 (FIG. 1) treats spectral radiation exchange in great detail, it does not directly consider specular reflections. A diffuse reflector is a surface whose bi-directional reflectivity is independent of reflectance angle; and a diffuse emitter-absorber is a surface whose directional reflectivity (absorptivity or emissivity) is independent of incidence angle. The assumption of radiation diffusely emitting and reflecting surfaces is reasonable since many reflections and re-reflections within an enclosure tend to average out radiative nonuniformities even when there are very smooth surfaces in the enclosure. For many practical problems, the diffuse analysis is actually valid and will give satisfactory results. The assumptions of diffuse surfaces is not valid for the enclosure with very "irregular" geometry such as long, narrow cracks with smooth surfaces, which need to be treated as specular reflectors by special approaches, such as Monte-Carlo or ray-tracing methods.

The processing unit 110, under control of the modeling program 111, calculates a model from the input parameters corresponding to the thermal system to be modeled by the modeling apparatus 101. The following discussion defines the underlying principles and calculations used by the modeling apparatus to calculate the exchange of radiant thermal energy. The principles described below are more fully described in Aili Ting, "The Influence of Wavelength-Dependent Radiation in Simulation of Lamp-Heated Rapid Thermal Processing Systems," (2nd International Rapid Thermal Processing Conference, RTP '94, Round Rock, Tex., 1994) pp. 102–109, incorporate herein by reference.

Net heat flux per unit wavelength $\lambda$, per unit area at each surface is:

$$\left(\frac{dq(\lambda)}{d\lambda}\right)_{net} = \left(\frac{dq(\lambda)}{d\lambda}\right)_{incoming} - \left(\frac{dq(\lambda)}{d\lambda}\right)_{emission} -$$

$$\left(\frac{dq(\lambda)}{d\lambda}\right)_{reflection} - \left(\frac{dq(\lambda)}{d\lambda}\right)_{transmission}$$

$$= \left(\frac{dq(\lambda)}{d\lambda}\right)_{absorbtion} - \left(\frac{dq(\lambda)}{d\lambda}\right)_{emission}$$

The incoming flux per unit for all opaque or non-opaque surface elements is described by a vector-matrix equation resulting from a thermal balance inside the reactor, as $$\left(\frac{dq(\lambda)}{d\lambda}\right)_{incoming} = [I - S \, diag \, R_e(\lambda) -$$

$$S_l \, diag \, T_r(\lambda)]^{-1} * S \, diag(E(\lambda) \, e_{\lambda b}(\lambda, T)$$

where I is the identity matrix, T is temperature, S is the view factor matrix, $S_1$ is related to S and will be explained later, Re is the reflection matrix, and Tr is the transmission matrix. Planck's spectral distribution of emissive power for a blackbody is given as $$e_{\lambda b}(\lambda, T) = \frac{2\pi C_1}{\lambda^5 \left(\exp\left(\frac{C_2}{\lambda T}\right) - 1\right)},$$

where $C_1$ and $C_2$ are Planck's constants.

The reflection matrix $R_e(\lambda)$ is diagonal matrix that represents the fraction of incoming energy reflected as a result of multiple internal reflections, $$R_e(\lambda) = \rho(\lambda) \left[ 1 + \frac{(1 - \rho(\lambda))^2 (\tau(\lambda))^2}{1 - (\rho(\lambda))^2 (\tau(\lambda))^2} \right],$$

where $\rho$ is reflectivity and $\tau$ is transmissivity. For an opaque surface, $R_e(\lambda) = diag \, \rho(\lambda) = I - diag \, \epsilon(\lambda)$, where $\epsilon(\lambda)$ is the emissivity. The transmission matrix $T_r(\lambda)$ is a diagonal matrix that represents the fraction of incoming energy that is transmitted as a result of multiple reflections in a non opaque media, $$T_r(\lambda) = \frac{(1 - (\rho(\lambda)))^2 \tau(\lambda)}{1 - (\rho(\lambda))^2 (\tau(\lambda))^2}.$$

$T_r$ becomes a zero matrix for an opaque surface. The absorption or emission matrix E is a diagonal matrix that represents the fraction of incoming energy absorbed as the result of multiple reflections in a non opaque media, $$E(\lambda) = \frac{(1 - \rho(\lambda))(1 - \tau(\lambda))}{1 - \rho(\lambda) \tau(\lambda)},$$

$E(\lambda) = diag \epsilon(\lambda)$ for an opaque surface. Because $\rho(\lambda) + \tau(\lambda) + \epsilon(\lambda) \equiv 1$, the above expression satisfies the equation:

$$R_e(\lambda) + T_r(\lambda) + E(\lambda) \equiv I.$$

$S_1$ is a matrix related to the view factor matrix S in such a way that $(S_1)_{ij} = (S)_{i,j1}$. This provides a method to predict radiation exchange between surfaces separated by a semi-transparent material (i.e., quartz window 202). The subscripts j and $j_1$ represent surface elements on opposite sides of the RTP quartz window.

Integrating over all wavelengths, the total heat flux to each surface is $$Q_{rad}(T) = \int_0^{\lambda^{max}} diagA \{ diagE(\lambda) \, [I - S \, diagR_e(\lambda) -$$

$$S_l \, diagT_r(\lambda)]^{-1} S - I \} * diag[E(\lambda) e_{\lambda b}(\lambda, T)] d\lambda +$$

$$diagA \{ diagE(\lambda_{max}) \, [I - S(I - diag\epsilon(\lambda_{max}))]^{-1} S - I \} *$$

$$diagE(\lambda_{max})(I - F)\sigma T^4$$

where A is the diagonal matrix of surface element area, and $$F = \frac{1}{\sigma T^4} \int_0^{\lambda_{max}} e_{\lambda b}(\lambda, T) d\lambda$$

is the fractional blackbody emission, and $\lambda_{max}$ is the wavelength after which the surface becomes opaque, $\tau=0$, and $\epsilon$=constant.

Numerically, the integrals are evaluated by using the conventional trapezoidal rule, $$\int_0^{\lambda_{max}} A \, d\lambda = \frac{1}{2} \sum_{n=1}^{N-1} (A_n + A_{n+1})(\lambda_{n+1} - \lambda_n)$$

where N is the maximum wavelength grid number for $\lambda_{max}$. The equation representing the vector of net radiative fluxes to all surface elements, $Q_{rad}(T)$ can be interpreted physically $$Q_{rad}(T) = \int_0^\infty \underbrace{\overbrace{\overbrace{\text{diag}A \; \text{diag}E(\lambda)[I - S\text{diag}R_e(\lambda) - S_1 \text{diag}T_r(\lambda)]^{-1}}^{\text{total incoming flux, including reflection and transmission}} \overbrace{S\text{diag}E(\lambda)e_{\lambda b}(\lambda, T)}^{\text{emission from all surfaces}}}^{\text{absorbed flux}} d\lambda} - \int_0^\infty \underbrace{\text{diag}A \; \text{diag}(E(\lambda)e_{\lambda b}(\lambda, T))d\lambda}_{\text{emitted flux}}$$

The above banded wavelength-dependent radiation model is general. Thus, the modeling apparatus 101 can be used to evaluate and predict wavelength-dependent thermal transport in any dimensional thermal system. Radiation heat flux at surfaces generally provides the surface thermal boundary conditions of the system. Since the instant invention considers only one-dimensional (radial) thermal conduction in the wafer 208, support 209 and window 202, the thermal balance forms a one-dimensional partial differential equation (PDE) system with radiation heat flux at the surface serving as a heat source term in the equation for the element on which the surface resides. The thermal balance also involves thermal convection at the surfaces of the wafer 208 and window 202 due to flowing gas which forms another heat source term in the one-dimensional thermal energy equation. Therefore, the matrix-form of the thermal energy equation for all elements of the wafer 208, support 209, and window 202 can be treated as $$C \frac{\partial T}{\partial t} = Q'_{rad}(T) + Q_{cond}(T) + Q_{conv}(T),$$

$$Q'_{rad}(T) = Q_{rad}^{top}(T) + Q_{rad}^{bottom}(T) \; (+ Q_{rad}^{edge}(T)),$$

where C is the element capacity vector, $C=\rho c_p V$, where $\rho$ is the mass density, $c_p$ is specific heat, and V is the volume. The radiation contribution at the top and bottom surfaces is evaluated from the banded radiation model. The radiation heat flux at the wafer edge gives a boundary condition for cases without the wafer support 209.

The radial conduction is represented by the discrete (finite difference) form of $$Q_{cond}(T) = \frac{\partial}{\partial T} \left( k(T) A(r) \frac{\partial T}{\partial r} \right),$$

where A(r) is the cross-sectional area of the window 202 or wafer 208 and k(T) is the thermal conductivity. The discrete form consists of a tri-diagonal matrix multiplied by the temperature vector. Symmetric boundary conditions are applied at the center of the wafer 208 and window 202. Conducting or adiabatic boundary conditions are applied at the support 209 and wall 210 interface if there is a ring-support and radiation heat flux is applied at wafer edge if the wafer is supported by pins. A thermal contact resistance or radiation heat flux is applied at the wafer 208 and support 209 interface for the ring-support.

Convection at the top and bottom surfaces is represented by $$Q_{conv}(T) = -h(p,T)A_s(r)(T-T_{gas}),$$

where $A_s(r)$ is the surface area, h(p,T) is the pressure- and temperature-dependent convection coefficient. $T_{gas}$ is the temperature of the gas. The discrete form of the convection term consists of a diagonal matrix multiplied by a temperature vector.

As more fully described below, the modeling apparatus can be used to first model the spectral radiation transport in the RTP reactor 201 and then to receive a prescribed wafer time-dependent temperature profile and provide the necessary time-dependent lamp intensity control to achieve the proscribed profile. For this purpose, the instant invention treats the lamps 205 as a surfaces in the lamp housing 204. A relationship between the lamp temperature and the applied lamp power can be readily derived. The lamp power and temperature are related as follows, $$P = A\sigma(T^4 - T^4_{wall})$$

where P is the lamp 205 power, A is the lamp 205 area, $\sigma$ is the Stefan-Boltzmann constant, T is the lamp 205 temperature and $T_{wall}$ is the chamber wall 210 temperature. For the simple case that the lamps are flat cylindrical rings at the top of the chamber, as illustrated in FIG. 2, the area of each lamp ring $A=\pi(R_o^2 - r_i^2)$, where $r_o$ and $r_i$ are the outer and inner radii of the lamp ring, respectively.

The above described PDE may be solved by modeling apparatus 101 using known techniques such as DASSL software described more fully in R. J. Kee, L. Petzold, *A Differential/Algebraic Equation Formulation of the Method-of-Lines Solution to Systems of Partial Differential Equations*, Sandia National Laboratories Report, SAND82-8893 (1986), L. R. Petzold, *A Description of DASSL: A Differential/Algebraic Solver* Sandia National Laboratories Report, SAND82–8637 (1982), and K. Brennan, S. L. Campbell, and L. R. Petzold, *Numerical Solution of Initial-Value Problems in Differential-Algebraic Equations*, New York: North Holland (1989), the contents of which are incorporated herein by reference. In general, the modeling apparatus uses a general method-of-lines approach to convert the PDE to an ordinary differential equation (ODE). DASSL is designed to solve stiff differential-algebraic systems (DAE) of the form $g(t, y, y')=0$, rather than $y'=f(t, y)$. DASSL is a variable-order method based on the backward-differentiation-formula (BDF) methods. DASSL uses error-estimation methods to choose a sequence of time steps that controls local truncation error.

The modeling apparatus of the instant invention was tested for use in design and control of an RTP reactor as described below. In the examples provided, 11 radial elements are used each to represent the wafer 208 and the window 202.

The reactor 201 radius is 12.0 cm, the lamp-to-window separation is 4.9 cm, the window-to-wafer separation is 0.165 cm, and the wafer-to-showerhead (located at the bottom of the reactor and not shown) is 3.43 cm. A quartz window 202 of thickness 12.7 cm is provided and a silicon wafer 208 of thickness 0.635 mm is provided. There are four lamp 205 rings at the top of the reactor having center radii of 2.223 cm, 5.08 cm, 7.84 cm, and 10.9 cm. Each lamp 205 ring has a width of 1.5 cm. A graphite wafer support 209 spans the distance from the wafer edge to the reactor wall 210. The view factors for such a system can be calculated analytically. The modeling apparatus of the instant invention is capable of predicting radiation effects in three dimensional geometries for such an RTP reactor.

Figure 3B:
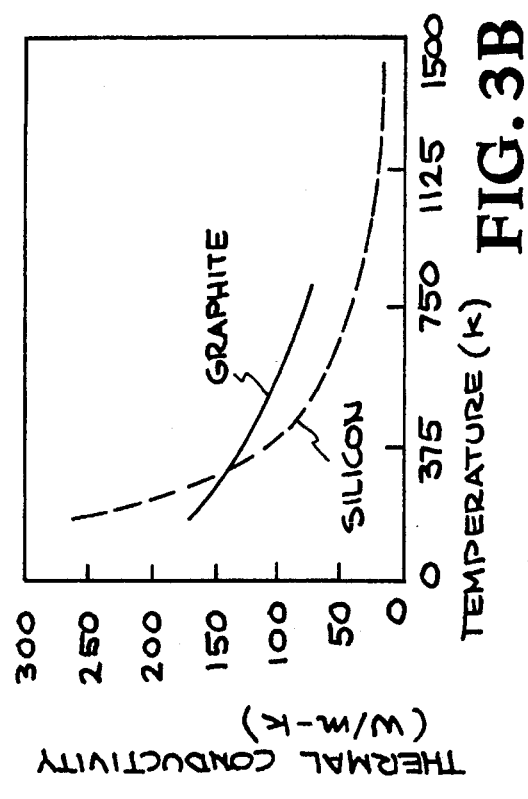
Figure 3D:
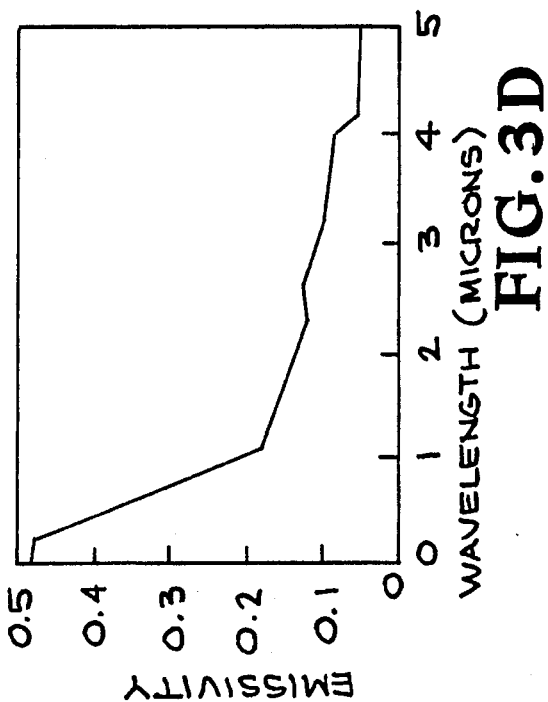
Figure 3A:
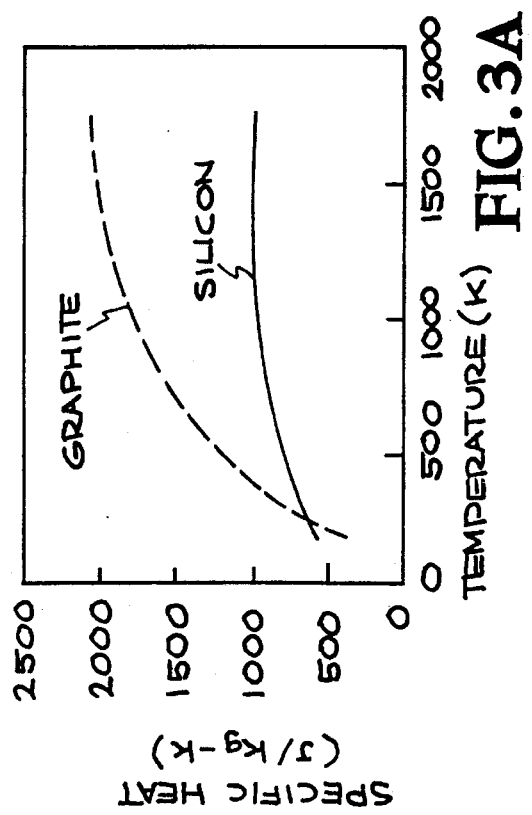
Figure 3C:
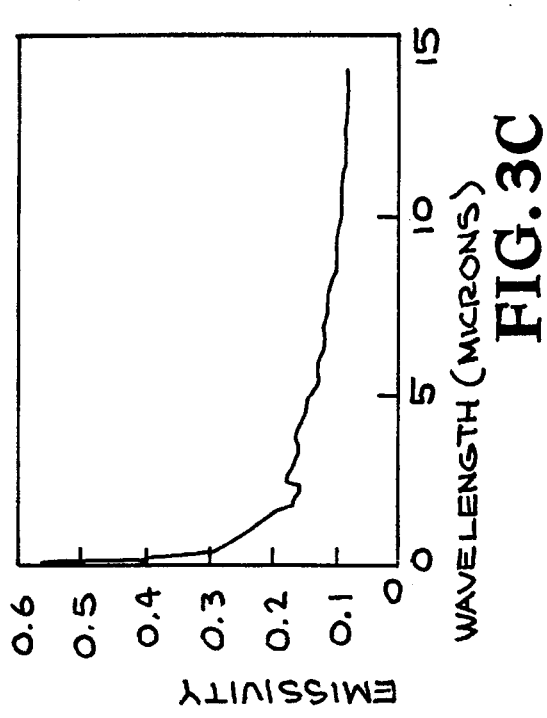

The mass densities of the wafer 208, window 202, and support 209 are 2330, 2200, and 7801 kg/m$^3$ respectively. The thermal conductivity of the window is held constant at 744.8 J/kg-K. FIGS. 3A–3H illustrate graphically the proportions of materials used in the test of the modeling apparatus. FIGS. 3A and 3B show the specific heats and temperature-dependent conductiveness for silicon and graphite. The band-dependent emissivity of stainless-steel is shown in FIG. 3C. The emissivity of the graphite support is fixed at 0.95. We use a fixed emissivity of 0.05 to represent the reflector material at the top of the chamber. We take the emissivity of the lamps to be that of tungsten, $\epsilon=0.45$ or as a function of wavelength as shown in FIG. 3D. FIG. 3E shows the transmissivity and refractive index for quartz. This data can be used to determine the wavelength-dependent quartz emissivity, (in one test the quartz emissivity was determined to be $0.8 * (1-\tau)$, in another it is fixed at $(1-\tau-\rho)$ where reflectivity is taken as 0.05). The wavelength-dependent transmissivity of quartz is also shown in FIG. 3E. The wavelength- and temperature-dependent silicon-wafer emissivity is shown in FIG. 3F. FIG. 3G shows the wavelength- and temperature-dependent silicon-wafer transmissivity. FIG. 3H illustrates an approximation where the emissivity of the wafer is only a function of temperature.

Each of the tests (simulations) carried out using the modeling apparatus 101 to predict the behavior of an RTP reactor used 14 bands that are defined to capture features of the wavelength-dependent material properties. Specifically, the bands were divided at wavelengths of 0, 0.17, 0.3, 0.4, 0.6, 1.1, 2.3, 2.6, 3.2, 4.0, 4.2, 8.0, 15.0, and $\infty$ µm. In spite of the fact that the window is effectively opaque beyond 4.2 µm, contributions to the wafer response from the longer wavelengths can be observed.

Figure 4:
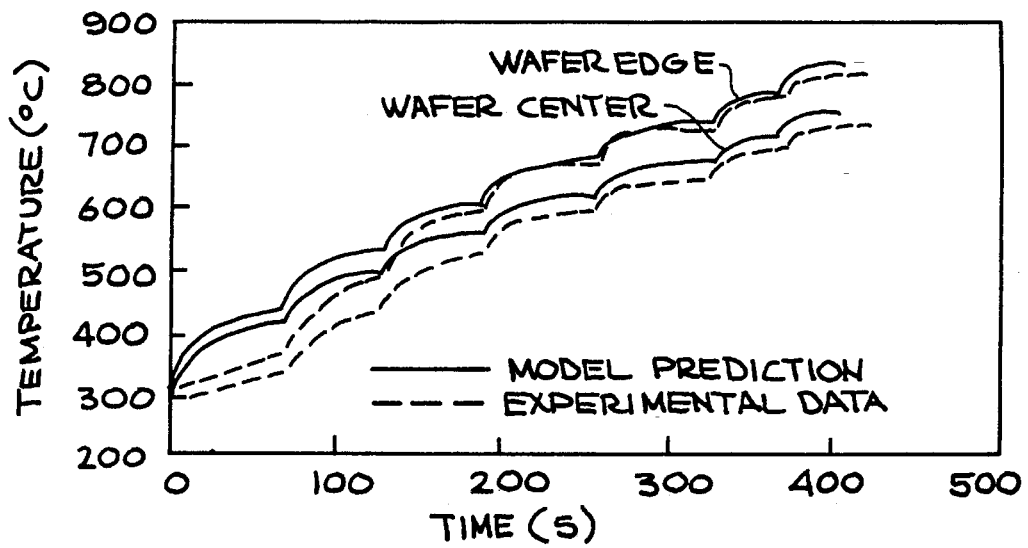
FIG. 4 is a graph illustrating the results of the apparatus of the instant invention compared with actual experimental data.

The output results of the modeling apparatus of the instant invention were compared to data from tests carried out on actual RTP reactors, where step power changes were applied to individual lamp rings. FIG. 4 shows data from one such test compared to predictions output by the modeling apparatus 101 of the instant invention. In this test only zone two, the maximum power of which is 11 kW, was varied. From 0 to 67 seconds 20% power was applied, from 67 to 127 seconds the power was 30%, from 127 to 190 seconds the power was 40%, from 190 to 250 seconds the power was 50%, from 250 to 324 the power was 60%, and from 324 to 364 seconds the power was 70%. The initial temperature for the entire system was 300° C. The modeling apparatus maintains wall temperatures at 27° C. throughout, although there is some ambiguity about the experimental wall temperatures at the start of the tests. Further, the modeling apparatus applied no convective heat transfer on either the wafer 208 or the window 202. An interface resistance of 0.1 W/m-K between the wafer 208 and the support 209 was used.

As illustrated in FIG. 4, a comparison of the modeling apparatus 101 predictions to the wafer center (upper curve) and edge temperature as measured by wafer-embedded thermocouples shows strong correlation of actual behavior. Initially, there is an offset between the predicted and measured temperatures, but the comparison improves near the operating temperatures of the RTP reactor. Some of the disagreement at early times is due to uncertainty about the starting conditions in the experiment. The test demonstrates a degree of agreement between the model predictions and the actual data which is quite satisfactory. Thus, the results of the modeling apparatus can be used with confidence to predict effects of various approximations in the radiation transport and to facilitate the design of actual thermal systems.

FIGS. 5 and 6 illustrate radial temperature profiles in the wafer 209 at an instant in time. These profiles were generated using the modeling apparatus 101 to demonstrate the sensitivity of the modeling apparatus 101 to physical approximations. In other words, the modeling apparatus was used to predict the spectral radiation transport for a number of different thermal system characteristics. In each of the illustrated profiles, the input power settings were the same.

Figures 5A, 5B:
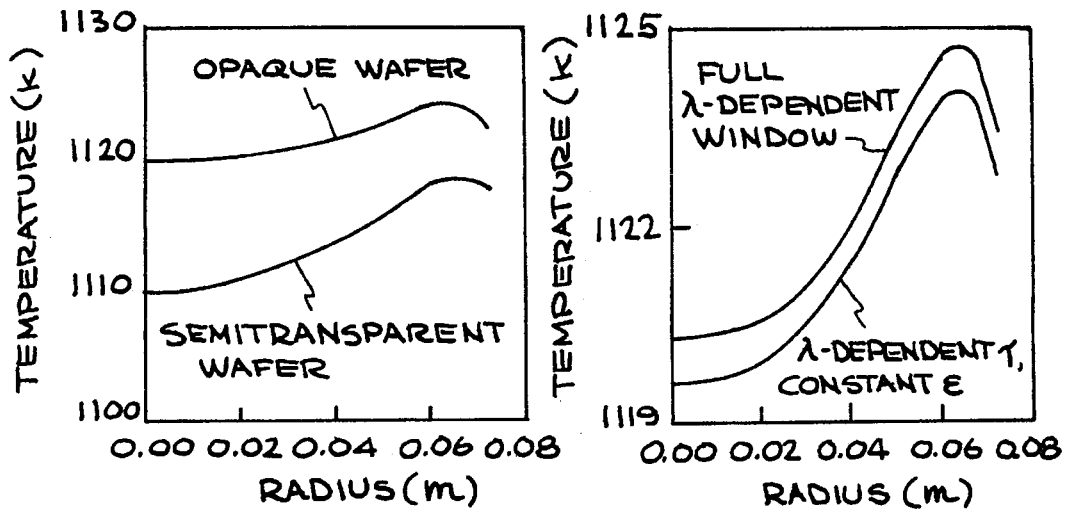
FIGS. 5A, 5B, 5C, and 5D are illustrated sensitivity to physical approximations in the apparatus and method of the instant invention.
Figures 5C, 5D:
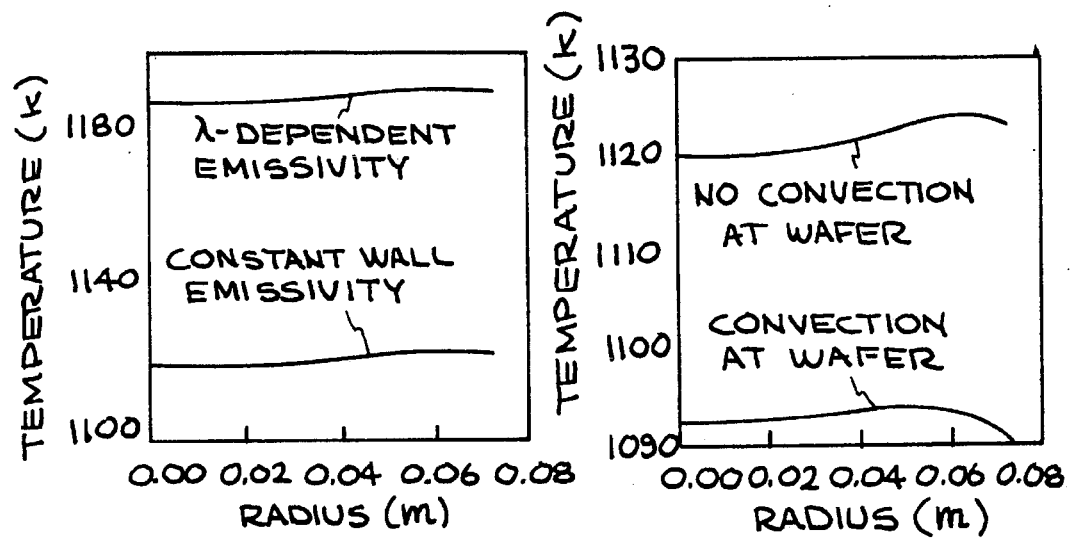

FIG. 5A illustrates the effect of allowing the silicon wafer 208 to be semitransparent, permitting transmission of the medium wavelength energy at low temperature. FIG. 5B compares input characteristics using a full wavelength-dependent window and a window with constant emissivity and wavelength dependant transmissivity. FIG. 5C illustrates the effect of banded wavelength radiation at the stainless-steel reactor-chamber walls 210. FIG. 5D contrasts the difference between the cases with and without convection at the wafer 208 surface.

Figure 6A:
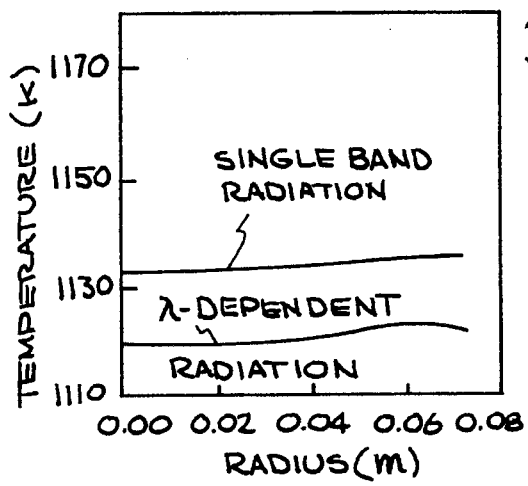
FIGS. 6A-6D illustrate sensitivity to additional physical approximations in the apparatus and method of the instant invention.
Figure 6B:
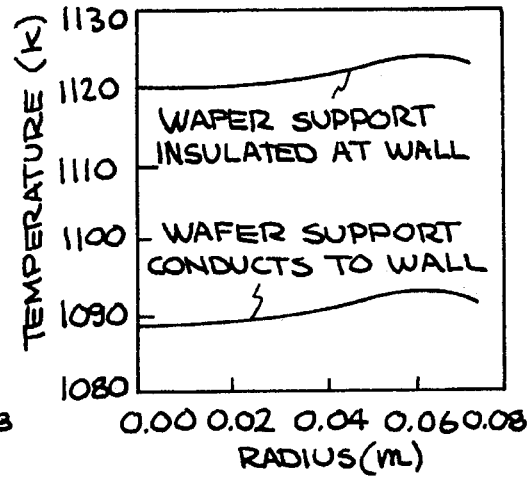
Figure 6C:
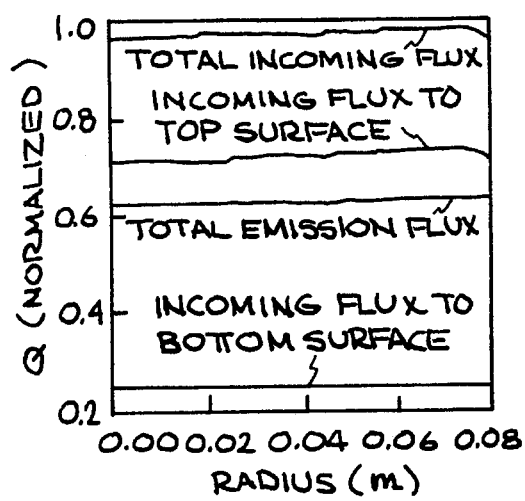
Figure 6D:
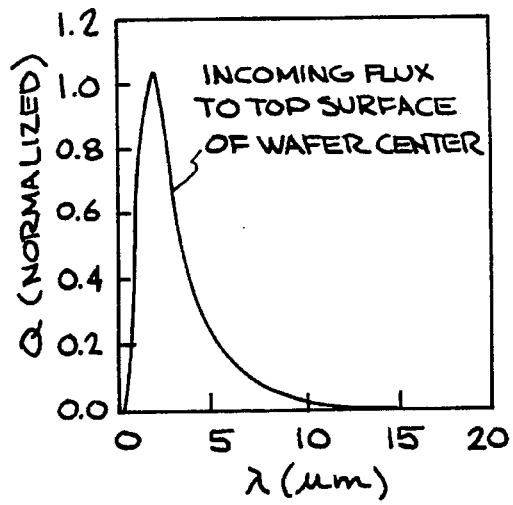

FIG. 6A compares single band and banded wavelength-dependent radiation. FIG. 6B compares conducting and insulated boundary conditions at the wafer support 209 and wall 210 interface. FIG. 6C illustrates normalized radiation heat fluxes over the wafer 208. FIG. 6D illustrates the normalized, banded wavelength-dependent, incoming heat flux to the top surface of the wafer 208 center.

FIGS. 5 and 6 illustrate the effect that different approximations have on the predicted wafer temperature. The magnitude of temperature differences depend on the radiative properties applied for the different cases. The fluxes illustrated in FIGS. 6C and 6D provide qualitative and quantitative views of how radiative heat is distributed on a wafer and over wavelength. Further, they illustrate how the effect of varying the input characteristic which corresponds to varying the proposed design of the RTP reactor can be immediately observed in the output of the modeling apparatus.

Using the above example of an RTP reactor, an example of how the inverse analysis can be implemented in the modeling apparatus of the instant invention is described. The transient trajectory of the wafer temperature is input into the modeling apparatus 101 as inverse parameters. Using these parameters, and the previously generated model, the lamp power trajectories required to meet the desired wafer trajectory can be calculated by converting the parabolic initial-boundary value problem into a differential-algebraic problem.

In the four-lamp-zone reactor illustrated in FIG. 2, the desired temperature trajectories at four points on the wafer 208 are specified. In addition to the residual equation resulting from the energy balance at each point on the wafer 208, as obtained from the initial prediction of the modeling apparatus, the specified trajectory introduces a new residual equation, $F_i = T_i - T_{set}(t)$. Since there are now two residual equations at four points on the wafer (the energy-equation residual and the trajectory constraint), the problem would be mathematically over specified unless new dependent variables were introduced. The modeling apparatus 101 selects the lamp powers as the needed dependent variables. Thus, rather than specifying the lamp powers as parameters or boundary conditions (the direct problem), the modeling apparatus 101 determines, as a function of time, the required lamp power input (the inverse problem) and outputs the results.

The direct problem can be solved without difficulty by a variety of methods, including the method-of-lines. The inverse problem, however, can cause great difficulty for traditional computational methods. One problem is that most ordinary-differential-equation software requires problem specification in the "standard form," where each residual equation must contain the time derivative of a dependent variable. The trajectory constraint equations do not fit that form. The algorithms that underpin the DASSL software can handle the problem specification and the solution, however, for the above described problems.

Figure 7:
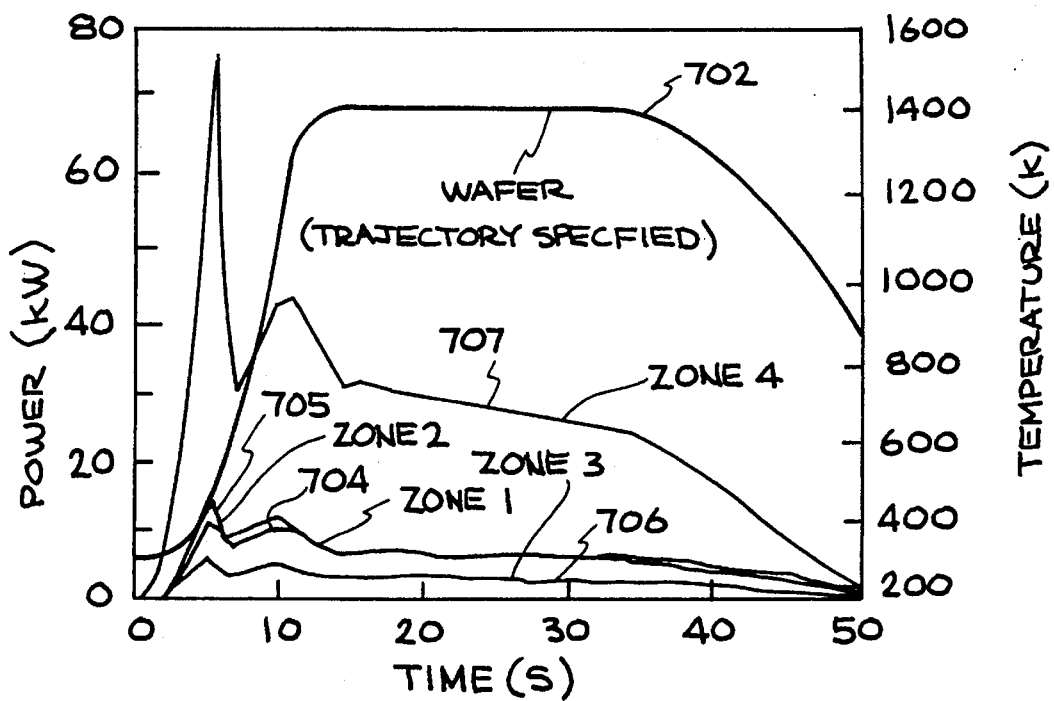
FIG. 7 illustrates an output of an inverse analysis of the instant invention.

FIG. 7 illustrates the output results of an inverse operation of the modeling apparatus 101 of the instant invention. The specified wafer trajectory 702 (shown as a heavy line), and the derived required lamp powers 704, 705, 706, 707 are shown as a function of time. As expected the lamp powers increase initially to drive the wafer temperature up according to the trajectory. After peaking at about 5 seconds, however, the lamp powers decrease even though the wafer temperature continues to increase. This behavior is caused by the fact that the silicon-wafer-infra-red-transmissivity changes rapidly around 600° C. from relatively high transmission to essentially opaque. Thus, because the radiation is coupled more effectively to heat the wafer, the lamps must reduce power to maintain the desired wafer trajectory.

As illustrated in FIG. 7, the inverse output can be used to provide control parameters in terms ofttimes and intensity for powering the heat lamps. In other words, for a desired wafer-temperature ramp, the inverse analysis predicts the required lamp power or cooling capacity. If the required lamp power exceeds that available in a given design, then the trajectory is infeasible, regardless of the controller strategy. Thus, the reactor must be redesigned or a less-aggressive trajectory considered. Inverse analysis also provides information on "control authority," which relates to the ability of the actuators to respond quickly enough. Lamps typically have very fast response time, but resistive heaters or cooling systems may not have the dynamic response needed to accomplish certain trajectories. This information can be used to specify actual reactor designs and as feedback in developing control programs.

The instant invention has been described above in connection with specific embodiments. The principles of the invention are not so limited. Many variations on the uses of the instant invention will be apparent from the preceding disclosure. Accordingly, the invention is only limited by the appended claims.

What is claimed is:

1. A method of controlling a rapid thermal processing (RTP) reactor for processing a silicon wafer under a desired wafer time dependent temperature profile, the RTP reactor including at least one heating element and a partially transmitting component separating the heating element and the wafer, the method comprising the steps of:

generating in a computer a spectral thermal radiation transport model of the RTP reactor for given heating element parameters;

inputting into the computer data specifying the desired wafer time dependent temperature profile;

selecting components for the RTP reactor based on the generated model;

calculating an inverse of the generated model using the data specifying the desired wafer time dependent temperature profile to determine heating element parameters required to produce the desired wafer time dependent temperature profile, wherein the selecting step selects the components for the RTP reactor to meet control parameters indicated by the inverse of the generated model; and controlling the heating elements of the RTP reactor in accordance with the heating element parameters to heat the wafer in accordance with the desired wafer time dependent temperature profile.

2. A method as recited in claim 1, wherein the inputting step comprises the steps of:

selecting a number of prescribed locations in the wafer; and assigning each of the prescribed locations a corresponding temperature time dependence as the data specifying the desired wafer time dependent temperature profile.

3. A method of designing a rapid thermal processing (RTP) reactor for processing a silicon wafer, the RTP reactor including at least one lamp heating element and a partially transmitting component separating the lamp heating element and the wafer, the method comprising the steps of:

inputting data into a computer corresponding to a general design of the RTP reactor including at least a thermal transport characteristic of the partially transmitting component and the wafer and a general design of the thermal radiation characteristic of the lamp heating element;

generating in the computer a model of spectral thermal radiation transport of the RTP reactor based on the input data;

selecting components for the RTP reactor based on the model;

inputting data corresponding to a desired time dependent temperature profile of the wafer to be processed in the RTP reactor;

storing the data corresponding to the desired time dependent temperature profile in a memory;

retrieving the stored data and utilizing the computer to calculate an inverse of the model to obtain control parameters for the heating element necessary to heat the wafer in accordance with the retrieved data; and providing a control portion to control the heating element based on the control parameters obtained from the inverse of the model.

4. A method as recited in claim 3, further comprising the step of utilizing the computer to calculate an inverse of the model, wherein the selecting step includes the step of selecting components for the RTP reactor to meet control parameters indicated by the inverse of the model.

5. A method of designing a rapid thermal processing (RTP) reactor for processing a silicon wafer, the RTP reactor to include at least one lamp heating element and a partially transmitting component separation the lamp heating element and the wafer, the method comprising the steps of:

inputting data into a computer corresponding to a general design of the RTP reactor including at least the thermal transport characteristic of the partially transmitting component and the wafer and the general design of the thermal radiation characteristic of the lamp heating element;

generating in the computer a model of spectral thermal radiation transport of the RTP reactor based on the input data; and selecting components for the RTP reactor based on the model;

utilizing the computer to calculate an inverse of the model to obtain control parameters for the heating element necessary to heat the wafer in accordance with a desired time dependent temperature profile of the wafer to be processed in the RTP reactor; and providing a control portion to control the heating element based on the control parameters obtained from the inverse of the model, wherein the selecting step includes the step of selecting the components for the RTP reactor to meet the control parameters indicated by the inverse of the model.

6. A method as recited in claim 5, wherein the utilizing step comprises the steps of:

selecting a number of prescribed locations in the wafer;

assigning each of the prescribed locations a corresponding temperature time dependance; and determining the control parameters for the heating element as a function of the corresponding temperature time dependance constrained by the model of the spectral thermal radiation transport of the RTP reactor.

7. A system including a modeling apparatus for accurately characterizing time dependent spectral thermal radiation transport of a thermal system, the thermal system including a first portion having one or more heating elements, and a second portion separated from the first portion by a partially transmitting medium, the modeling apparatus comprising:

an input device for inputting characteristics of the thermal system;

a memory connected to the input device for storing the thermal system characteristics, the thermal system characteristics including at least geometric parameters of the thermal system, a time dependent intensity profile of the heating elements and wavelength-dependent properties of the partially transmitting medium;

a processing unit connected to the memory, the processing unit predicting a time dependant spectral thermal radiation transport characteristic of the thermal system based on the thermal system characteristics, said processing unit producing a characteristic model of the thermal system using the time dependant spectral thermal radiation transport characteristic.

8. A system as recited in claim 7, wherein the modeling apparatus further comprises:

a second input device for inputting inverse parameters specifying a desired thermal transport characteristic of the thermal system wherein said processing unit is coupled to said second input and is configured to produce an inverse of the characteristic model, the inverse of the characteristic model indicating a characteristic of the thermal system which is necessary to produce the desired thermal transport characteristic.

9. A system as recited in claim 8, wherein the desired thermal transport characteristic is a time dependent temperature at a location within the second portion of the thermal system and the characteristic of the thermal system which is necessary to produce the desired thermal transport characteristic is a time dependent intensity profile of the heating elements.

10. The system as recited in claim 7, further comprising:

developing means coupled to the modeling apparatus for developing a control program for controlling the heating elements of the thermal system, the developing means receiving from the modeling apparatus temperature indications corresponding to a modeled temperature at selected locations within the characteristic model of the thermal system and providing to the modeling apparatus the time dependent intensity profile of the heating elements on a basis of heating element control parameters indicated by the control program; add input means coupled to the developing means for modifying the control program on a basis of an output from the modeling apparatus.

11. The system as recited in claim 10, further comprising interface means connected between the developing means and the modeling apparatus for controlling exchange of information between the developing means and the modeling apparatus.

12. The system as recited in claim 11, wherein the developing means and the modeling apparatus are simultaneously run on separate computing platforms and the interface means emulates an actual thermal system in real-time using an output from the modeling apparatus for the development of the control program.

13. The system as recited in claim 10, wherein the thermal system is coupled to the developing means, wherein the developing means receives actual real-time data from the thermal system which is used by the developing means to adjust the time dependent heating profile of the heating elements that is provided to the modeling apparatus, and wherein the system is a closed loop system.

* * * * *